United States Patent [19]

Yamashita

[11] Patent Number: 5,515,810
[45] Date of Patent: May 14, 1996

[54] METHOD AND APPARATUS FOR MANUFACTURING SEMI-INSULATION GAAS MONOCRYSTAL

[75] Inventor: Youji Yamashita, Shizuoka, Japan

[73] Assignee: Kabushiki Kaisha Toshiba, Kawasaki, Japan

[21] Appl. No.: 407,958

[22] Filed: Mar. 22, 1995

[30] Foreign Application Priority Data

Mar. 23, 1994 [JP] Japan .................................. 6-051878

[51] Int. Cl.⁶ ............................................... C30B 15/12
[52] U.S. Cl. ................. 117/17; 117/18; 117/21; 117/31; 117/213
[58] Field of Search .................. 117/17, 18, 21, 117/31, 213

[56] References Cited

U.S. PATENT DOCUMENTS

| | | | |
|---|---|---|---|
| 4,528,061 | 7/1985 | Miyazawa et al. | 117/17 |
| 4,980,015 | 12/1990 | Ono et al. | 117/213 |
| 5,021,225 | 6/1991 | Yamashita et al. | |
| 5,034,200 | 7/1991 | Yamashita et al. | 117/21 |
| 5,073,229 | 12/1991 | Yamashita et al. | |
| 5,145,550 | 9/1992 | Tada et al. | 117/17 |

FOREIGN PATENT DOCUMENTS

| | | | |
|---|---|---|---|
| 226794 | 7/1987 | European Pat. Off. | 117/17 |
| 62-241896 | 10/1987 | Japan | 117/17 |
| 03-183687 | 8/1991 | Japan | 117/18 |

OTHER PUBLICATIONS

Willardson et al, "*Semiconductors and Semimetals,* vol. 20 Semi–Insulating–GaAs" Academic Press, Orlando 1984 pp. 206–208.

*Primary Examiner*—Robert Kunemund
*Attorney, Agent, or Firm*—Oblon, Spivak, McClelland, Maier & Neustadt

[57] ABSTRACT

To manufacture a low-carbon concentration GaAs wafer required for devices such as hall sensors, FETs, HEMTs etc. at a high production yield without deteriorating the semi-insulation characteristics thereof, a method of manufacturing a semi-insulation GaAs monocrystal by controlling carbon concentration during crystal growth by a simple method is disclosed. The method of manufacturing a semi-insulation GaAs monocrystal in accordance with liquid encapsulated Czochralski method, comprises the steps of: preparing a crucible (5) formed with a crucible body (6) and a small chamber (8) communicating with a lower part of the crucible body and a carbon heater (4) processed to reduce surface blow holes thereof; putting a melted GaAs liquid and a sealing compound $B_2O_3$ in the crucible housed in an airtight vessel in such a way that the sealing compound $B_2O_3$ is on the melted GaAs liquid and further the melted GaAs liquid put in the small chamber contains carbon to be supplied to the melted GaAs liquid in the crucible body; heating the crucible by the heater housed in the airtight vessel; and pulling up the melted GaAs liquid from the crucible body by keeping the airtight vessel at a high pressure.

15 Claims, 5 Drawing Sheets

METHOD AND APPARATUS FOR MANUFACTURING SEMI-INSULATION GAAS MONOCRYSTAL

BACKGROUND OF THE INVENTION

The present invention relates to a method of manufacturing a chemical compound semiconductor monocrystal grown by LEC (liquid encapsulated Czochralski) method, and more particularly to a method of manufacturing semi-insulation GaAs monocrystal used for electronic devices such as Hall Sensors, high-frequency EFTs, etc.

In the case where SI (semi-insulation) GaAs monocrystal is manufactured in accordance with LEC method, even if impurities are not positively introduced for reason of monocrystal formation, acceptor impurities such as carbon, boron, etc. inevitably exist in the monocrystal. In the manufacturing process of electronic devices using SI GaAs substrate, it is required to reduce these impurities as much as possible, because these impurities deteriorate the device characteristics.

In general, when the impurities are carbon or boron, it is so far well known that there exists mutual relationship between the moisture concentration of a liquid encapsulating compound (referred to as sealing compound, hereinafter) $B_2O_3$ (used to pull up the monocrystal) and the impurity concentration in the crystal. Therefore, it has been so far adopted a method of preventing carbon or boron from being mixed with the crystal by controlling the moisture concentration in the sealing compound $B_2O_3$.

In practice, there exists such a tendency that the higher the moisture concentration in the sealing compound $B_2O_3$ is, the smaller will be the concentration of the impurities (carbon or boron) in the crystal. Further, irrespective of the moisture concentration in the sealing compound $B_2O_3$, it has been known that the carbon concentration is high near the crystal head but low near the crystal tail and the boron concentration is low near the crystal head but high near the crystal tail.

Therefore, in the case of the SI GaAs wafer used for the Hall Sensors, FETs, HEMTs, etc., it is particularly necessary to suppress the mixture of impurities of carbon and boron with the crystal, because these impurities cause characteristic dispersion and thereby the characteristics deteriorate.

Conventionally, the impurities such as carbon or boron have been suppressed by controlling the moisture concentration in the sealing compound $B_2O_3$.

In the conventional method of suppressing the impurities such as carbon and boron, however, there exists a problem in that when the carbon concentration is decreased at the crystal head, the carbon concentration decreases excessively at the crystal tail so that the semi-insulation characteristics are not obtained. In other words, there exists a limit of reducing the carbon concentration, as a matter of course.

SUMMARY OF THE INVENTION

Accordingly, it is the object of the present invention to provide a method of manufacturing a semi-insulation GaAs monocrystal by controlling carbon concentration during crystal growth by a simple method, in order to manufacture a low-carbon concentration GaAs wafer required for devices such as Hall Sensors, FETs, HEMTs etc. at a high production yield without deteriorating the semi-insulation characteristics thereof.

To achieve the above-mentioned object, the present invention provides a method of manufacturing a semi-insulation GaAs monocrystal in accordance with liquid encapsulated Czochralski method, which comprises the steps of: preparing a crucible formed with a crucible body and a small chamber communicating with a lower part of the crucible body, and a carbon heater processed to reduce surface blow holes thereof; putting a melted GaAs liquid and a sealing compound $B_2O_3$ in the crucible housed in an airtight vessel in such a way that the sealing compound $B_2O_3$ is on the melted GaAs liquid, the melted GaAs liquid put in the small chamber containing carbon to be supplied to the melted GaAs liquid put in the crucible body; heating the crucible by the heater housed in the airtight vessel; and pulling up the melted GaAs liquid from the crucible body by keeping the airtight vessel at a high pressure.

Further, the present invention provides a method of manufacturing a semi-insulation GaAs monocrystal in accordance with liquid encapsulated Czochralski method, which comprises the steps of: preparing a crucible formed with a crucible body and a small chamber communicating with a lower part of the crucible body, and a carbon heater processed to reduce surface blow holes thereof; putting a melted GaAs liquid and a sealing compound $B_2O_3$ in the crucible housed in an airtight vessel in such a way that the sealing compound $B_2O_3$ is on the melted GaAs liquid, moisture concentration of the sealing compound $B_2O_3$ put in the small chamber being determined lower than that of the sealing compound $B_2O_3$ in the crucible body; heating the crucible by the heater housed in the airtight vessel; and pulling up the melted GaAs liquid from the crucible body by keeping the airtight vessel at a high pressure.

Preferably, the carbon heater is processed by coating an amorphous carbon on a non-processed surface thereof.

Further, preferably, the moisture concentration of the sealing compound $B_2O_3$ is set less than 100 ppm in both the crucible body and the small chamber. Further, preferably, the moisture concentration of the sealing compound $B_2O_3$ is set less than 100 ppm in the crucible body and less than 50 ppm in the small chamber.

Further, preferably, a thickness of the sealing compound $B_2O_3$ in the small chamber is thinner than that of the sealing compound $B_2O_3$ in the crucible body.

Further, preferably, a cross-sectional area of the small chamber increases downward.

Further, the present invention provides an apparatus for manufacturing a semi-insulation GaAs monocrystal in accordance with liquid encapsulated Czochralski method, comprising: a crucible housed in an airtight vessel and formed with a crucible body and a small chamber communicating with a lower part of the crucible body, a melted GaAs liquid and a sealing compound $B_2O_3$ being both put in the crucible in such a way that the sealing compound $B_2O_3$ is on the melted GaAs liquid; and a heater housed in the airtight vessel, for heating said crucible, said heater being processed to reduce surface blow holes thereof.

The present invention will be summarized hereinbelow.

The features of the present invention for manufacturing the semi-insulation GaAs monocrystal in accordance with LEC method are as follows:

(1) The heater for heating and melting the raw material is a carbon heater coated with, for instance amorphous carbon, to reduce the blow hole rate on the surface thereof.

(2) When Ga and As (raw material of the crystal) are directly synthesized or melted, temperature rises. At this time, CO gas is degassed from the carbon material of the heater, so that the CO gas is mixed with the sealing compound $B_2O_3$. Further, carbon of CO gas mixed with the sealing compound $B_2O_3$ is further mixed with the melted GaAs liquid.

However, since carbon in the melted GaAs liquid is gettered by moisture ($H_2O$) of the sealing compound $B_2O_3$, the carbon concentration of the melted GaAs liquid put in the crucible decreases before pulling up a crystal, with the result that the carbon concentration of the melted GaAs liquid put in the small chamber is higher than that in the crucible.

The degasification of the CO gas from the carbon material of the heated heater is dependent upon the baking condition of the carbon material before the crystal pulling process.

Further, the removal efficiency of carbon mixed with the melted GaAs liquid and gettered by the moisture ($H_2O$) of the sealing compound $B_2O_3$ is determined roughly by the moisture concentration of the sealing compound $B_2O_3$. Therefore, it is possible to decide the carbon concentration of the head of the pulled-up crystal according to the baking condition of the carbon material (before pulling-up the crystal) and the moisture ($H_2O$) of the sealing compound $B_2O_3$ put in the crucible body.

On the other hand, the major source for generating CO gas from the carbon material when the heater is heated is the carbon heater. Therefore, the present invention is based upon the fact that it is possible to reduce the CO gas generation rate from the carbon heater markedly by processing the surface of the carbon heater.

When the surface of the carbon heater is coated with another substance such as PBN (Pyrolitic Boron Nitride), it is possible to reduce the CO gas generation rate from the heater roughly down to zero. In the present invention, the surface of the carbon heater is processed, that is, coated with a fine amorphous carbon, for instance. Therefore, in the carbon heater according to the present invention, since CO gas is generated due to a reaction between the amorphous carbon on the surface of the carbon heater and the atmosphere in the pull-up vessel, it is possible to markedly reduce the CO gas generation rate, as compared with the ordinary heater (not coated with amorphous carbon). This is because in the case of the ordinary heater, the atmosphere in the vessel permeates deep into the greater part (bulk) of the heater, so that the reaction area between atmosphere and heater carbon is greatly increased by several ten to several hundred times broader than that of the heater coated with amorphous carbon.

(3) Since the carbon in the melted GaAs liquid is gettered by the moisture ($H_2O$) of the sealing compound $B_2O_3$, the carbon concentration of the melted GaAs liquid in the crucible body before the start of pull-up differs according to the moisture ($H_2O$) of the sealing compound $B_2O_3$ in the crucible body. In the present invention, since the generation of CO gas can be reduced markedly by coating the surface of the carbon heater with amorphous carbon, the getter of the carbon in the melted GaAs liquid by the sealing compound $B_2O_3$ is weakened, so that a desired low carbon concentration level can be realized. In other words, it is possible to decide the moisture concentration of the sealing compound $B_2O_3$ in the crucible body so that the carbon concentration of the crystal head can be set to any desired value.

(4) Here, even if the moisture concentration of the sealing compound $B_2O_3$ in the crucible body is decided so that the carbon concentration of the crystal head may become any desired value, since the segregation coefficient of the carbon to GaAs is more than one and further the carbon in the melted GaAs liquid is being gettered by the moisture of sealing compound $B_2O_3$ during the pull-up process, when pulled up by use of the ordinary crucible, the carbon concentration in the pulled-up crystal decreases from the crystal head to the crystal tail gradually. Therefore, when a narrow dispersion width of the carbon concentration of the crystal is required, there exists the case where the carbon concentration becomes lower than the required carbon concentration at a half (near tail) part of the crystal.

In the method of the present invention, the carbon concentration of the melted GaAs liquid put in the small chamber is determined higher than that of the melted GaAs liquid put in the crucible body. Therefore, since the melted GaAs liquid put in the small chamber is kept supplied into the melted GaAs liquid put in the crucible body during the pull-up process, although the carbon in the melted GaAs liquid in the crucible body is gettered by the pulled-up crystal and the moisture of the sealing compound $B_2O_3$, carbon can be kept supplied from the small chamber to the crucible body. Therefore, in the method according to the present invention, it is possible to reduce the carbon concentration reduction rate from the crystal head to the crystal tail, as compared with the conventional method. Here, when the small chamber is appropriately designed and further the carbon concentration of the melted GaAs liquid in the small chamber are determined appropriately, it is possible to make the carbon concentration roughly uniform in the crystal from the head to the tail thereof.

The function of the present invention will be described hereinbelow.

The surface of the heater is processed in such a way that blow holes can be reduced in the heater surface by coating the heater surface with amorphous carbon, for instance. Therefore, it is possible to reduce the CO gas generated from the heater surface markedly. That is, a relatively small amount of CO gas is generated from the heater surface and then mixed with the sealing compound $B_2O_3$, so that the amount of carbon gettered by the moisture ($H_2O$) of sealing compound $B_2O_3$ is reduced. As a result, it is possible to set the moisture concentration of the sealing compound $B_2O_3$ required to getter carbon to a low level. Accordingly, even if the time from when the heater is heated to heat and melt the raw material to when a crystal is actually pulled up disperses, the amount of CO gas mixed with the sealing compound $B_2O_3$ is relatively small and further the dispersion rate of CO gas is also small.

For instance, in the case where the crystal is pulled up but stopped midway and then further pulled up again for some reason or other, if the moisture concentration of the sealing compound $B_2O_3$ is set high to getter the carbon as is conventional, there exists a problem in that the carbon concentration is reduced excessively by the gettering of the high moisture concentration. In the method of the present invention, however, since the moisture concentration of the sealing compound $B_2O_3$ required to getter carbon is set low, even if the crystal is pulled up again after having stopped midway, it is possible to prevent the carbon concentration from being reduced excessively.

Further, since the carbon concentration of the melted GaAs liquid put in the small chamber is determined higher than that of the melted GaAs liquid put in the crucible body so that carbon supplied to the crucible body can be contained in the melted GaAs liquid put in the small chamber, the melted GaAs liquid in the small chamber is kept supplied into the crucible body during the pull-up process. Although the carbon of the melted GaAs liquid in the crucible body is gettered by the pulled-up crystal and the moisture of the sealing compound $B_2O_3$, since carbon can be kept supplied from the small chamber to the crucible body, in the method according to the present invention, it is possible to reduce the carbon concentration reduction rate from the crystal head to the crystal tail, as compared with the conventional method.

Further, the higher the moisture concentration of the sealing compound $B_2O_3$ is, the higher will be the removal efficiency of carbon mixed with the melted GaAs liquid and gettered by the moisture ($H_2O$) of the sealing compound $B_2O_3$ increases. Therefore, the higher the moisture concentration of the sealing compound $B_2O_3$ is, the lower will be the carbon concentration of the crystal. Here, in order to set the carbon concentration in the melted GaAs liquid in the small chamber to be higher than that of the melted GaAs liquid in the crucible body, the moisture concentration of the sealing compound $B_2O_3$ in the small chamber is set lower than that of the sealing compound $B_2O_3$ in the crucible body. As a result, the melted GaAs liquid can be kept supplied from the small chamber to the crucible body during the pull-up process, so that carbon can be kept supplied from the small chamber to the crucible body. Therefore, in the method according to the present invention, it is possible to reduce the carbon concentration reduction rate from the crystal head to the crystal tail, as compared with the conventional method.

As described above, in the method of manufacturing semi-insulation GaAs monocrystal according to the present invention, since the non-processed heater surface is coated with amorphous carbon to make the surface smooth, that is, to reduce surface blow holes, it is possible to markedly reduce CO gas from being generated from the surface of the heater. Since the amount of CO gas generated from the heater surface is small, the amount of CO gas mixed with the sealing compound $B_2O_3$ is small. As a result, the amount of carbon gettered by the moisture ($H_2O$) of the sealing compound $B_2O_3$ can be reduced. As a result, it is possible to set the moisture concentration of the sealing compound $B_2O_3$ required to getter carbon to a low level. As a result, even if the time from when the heater is heated to heat and melt the raw material to when a crystal is actually pulled up differs, the amount of CO gas mixed with the sealing compound $B_2O_3$ is relatively small, and thereby the dispersion rate of CO gas concentration in the ambient gas (Ar) within the pressure vessel can be also reduced whenever the crystal is pulled up.

DETAILED DESCRIPTION OF THE EMBODIMENTS

An embodiment of the method of manufacturing semi-insulation GaAs monocrystal according to the present invention will be described hereinbelow with reference to the attached drawings.

Figure 1:
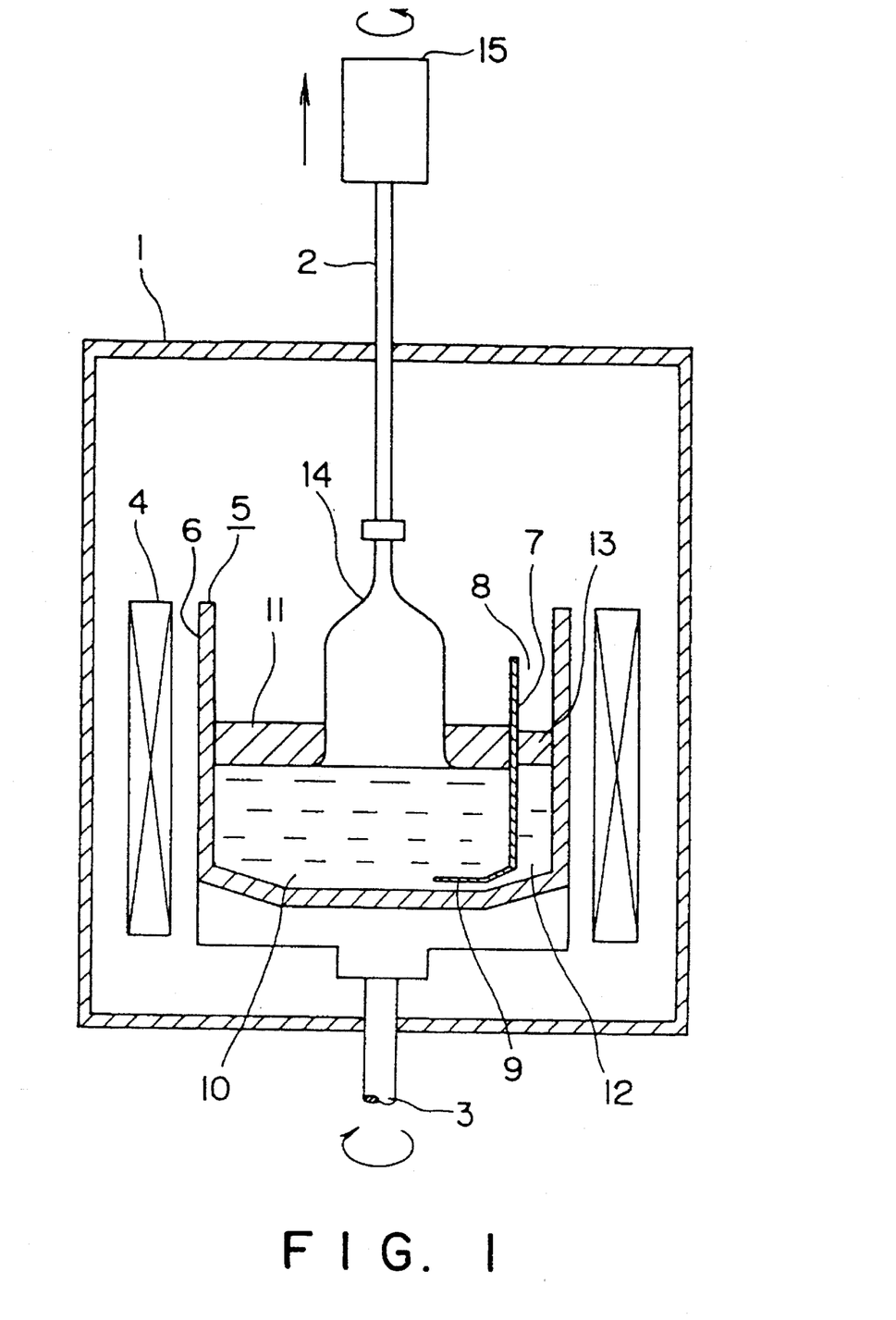
FIG. 1 is an illustration for assistance in explaining the method of growing a monocrystal.

FIG. 1 shows a monocrystal manufacturing apparatus used for realizing the method of the present invention. In FIG. 1, the apparatus has a high pressure airtight vessel 1. A pull-up shaft 2 is rotatably provided passing through the upper surface of the high pressure airtight vessel 1, and a crucible axle 3 is also rotatably provided passing through the lower surface of the same vessel 1. Within the high pressure airtight vessel 1, a crucible 5 and a heater 4 are housed. The heater 4 is disposed so as to encircle the crucible 5.

The crucible 5 is composed of a crucible body 6 and a small chamber 8 partitioned by a wall 7. The small chamber 8 communicates with the crucible body 6 at the lower portion thereof. The bottom of the wall 7 serves as a communication pipe 9 for connecting the small chamber 8 to the crucible body 6.

Before the crystal pulling process, the interior of the airtight vessel 1 is previously baked by use of the heater 4. A melted GaAs liquid 10 is put at the lower part of the crucible body 6, and a sealing (liquid encapsulating) compound $B_2O_3$ 11 is put at the upper part of the crucible body 6. In the same way, another melted GaAs liquid 12 is put at the lower part of the small chamber 8, and another sealing compound $B_2O_3$ 13 is put at the upper part of the small chamber 8.

Here, it is preferable that the moisture concentration of the sealing compound $B_2O_3$ 11 put in the crucible body 6 is determined higher than that of the sealing compound $B_2O_3$ 13 put in the small chamber 8. On the other hand, the carbon concentration of the melted GaAs liquid 10 put in the crucible body 6 is determined lower than that of the melted GaAs liquid 12 put in the small chamber 8, before the process of pulling up the melted GaAs liquid 10 put in the crucible body 6. Further, the thickness of the sealing compound $B_2O_3$ 13 put in the small chamber 8 is determined thinner than that of the sealing compound $B_2O_3$ 11 put in the crucible body 6.

The melted GaAs liquid 10 put in the crucible body 6 is pulled up as a pulled-up crystal 14 by the pull-up shaft 2. Further, a weight meter 15 for monitoring the weight of the pulled-up crystal 14 is provided on the upper portion of the pull-up shaft 2. The crucible 5 can be rotated by the crucible axle 3.

The method of manufacturing GaAs monocrystal in accordance with the liquid encapsulated Czochralski method will explained in detail hereinbelow.

Figure 2A:
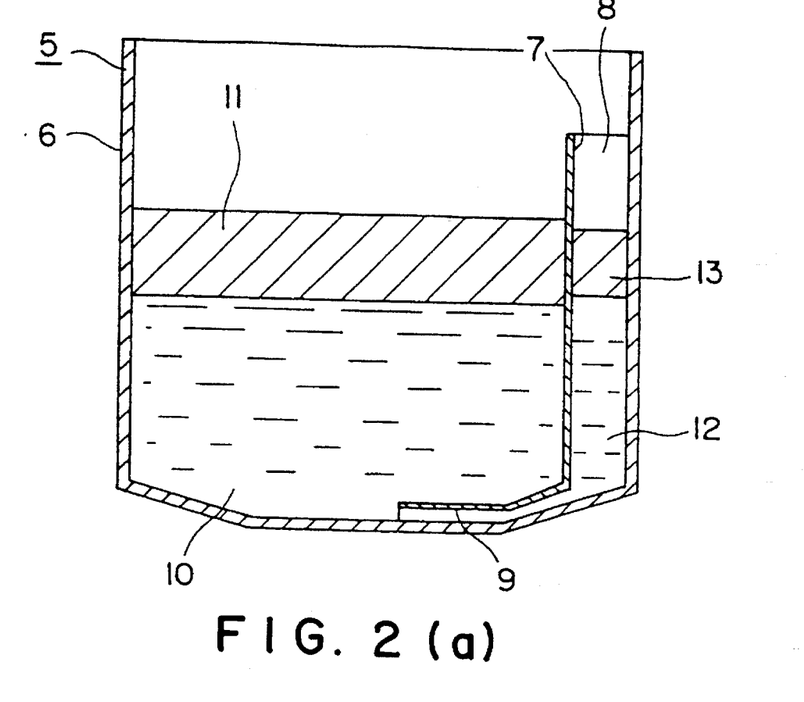
FIG. 2(a) is a longitudinal cross-sectional view showing a crucible having a crucible body and a small chamber both used for the method according to the present invention.
Figure 2B:
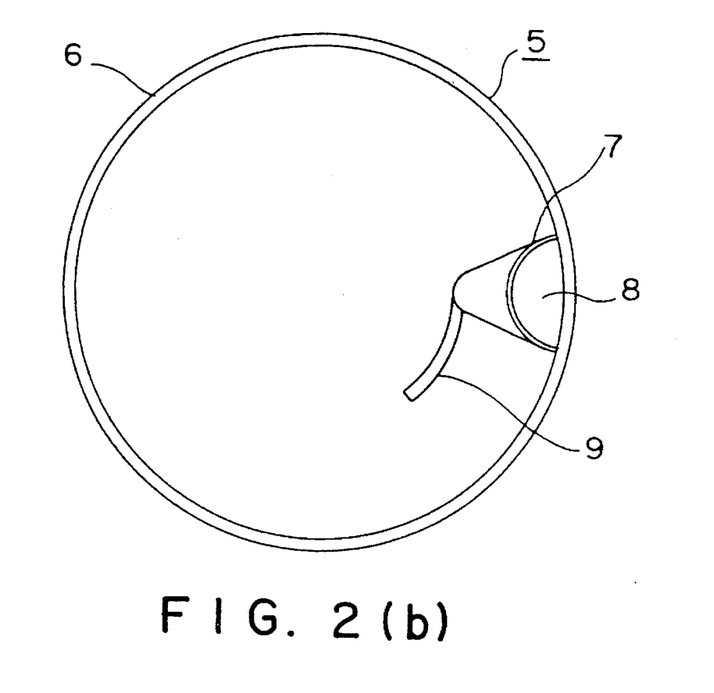
FIG. 2(b) is a top view showing the same crucible shown in FIG. 2(a)

The longitudinal cross section of the crucible 5 used for experiments is shown in FIG. 2(a) and the transverse cross section thereof is shown in FIG. 2(b). The side wall of the crucible 5 is 150 mm in inner diameter and formed of PBN (Pyrolitic Boron Nitride) of multi-layer structure. The wall 7 of the small chamber 8 and the communication pipe 9 are also formed of PBN. The transversal cross sectional area of the small chamber 8 is 8 cm² at the major portion (except the bottom near the communication pipe 9). However, it is preferable to change the size of the small chamber 8 freely according to the target values of the carbon and boron concentrations in the GaAs monocrystal to be controlled.

The GaAs having a raw material composition (in mol concentration) ratio of Ga to As of about 0.95 and the total weight of about 6.1 Kg and the sealing compound $B_2O_3$ having a weigh of 600 g were put in the crucible body 6. On the other hand, the GaAs having a raw material composition ratio of Ga to As of about 1 and the total weight of about 210 g and the sealing compound $B_2O_3$ having a weight is 20 g were put in the small chamber 8.

Further, the surface of the carbon heater 3 for heating the raw material was coated with amorphous carbon with a thickness of 2 to 3 μm. The amorphous carbon was grown in accordance with CVD (chemical vapor deposition) method.

Further, it is preferable that the moisture concentration in the sealing compound $B_2O_3$ put in the crucible body 6 is low. In these pull-up experiments, however, the sealing compounds having the moisture concentrations of three sorts of 30, 50 and 100 ppm were prepared. In the same way, it is preferable that the moisture concentration in the sealing compound $B_2O_3$ put in the small chamber 8 is also low. However, in these pull-up experiments, the sealing compound having the moisture concentration of 50 ppm was used.

Further, concerning the moisture concentration of the sealing compound $B_2O_3$ put in the crucible body 6, four sorts of 100, 150, 200 and 500 ppm were prepared. On the other hand, concerning the moisture concentration of the sealing compound $B_2O_3$ put in the small chamber 8, two sorts of 50 ad 100 ppm were prepared. Further, all the parts within the high pressure vessel 1 were baked before the crystall pulling process under the same conditions in every experiment.

Prior to the explanation of the experiments, some comparative experiments will be explained hereinbelow. In the first comparative experiments, the case using the crucible 5 having the crucible body 6 and the small chamber 8 (of the present invention) was compared with the case using the ordinary crucible having no small chamber. Further, in the second comparative experiments, the case using the heater 4 coated with amorphous carbon (of the present invention) was compared with the case using the ordinary heater not coated with the amorphous carbon.

First, a crystal was pulled up by use of the ordinary single structure crucible having no small chamber, and the mutual relationship data were obtained between the moisture concentration in the sealing compound $B_2O_3$ and the carbon concentration in the pulled-up crystal. The crucible was 150 mm in inner diameter and formed of PBN. The GaAs having a raw material composition ratio of Ga to As (Ga mol concentration/As mol concentration) of about 0.95 and the total weight of about 6.4 Kg was put in the crucible body 6 together with the sealing compound $B_2O_3$. The moisture concentrations of the sealing compounds $B_2O_3$ put in the crucible body were four sorts of 100, 150, 200, and 500 ppm.

Figure 3:
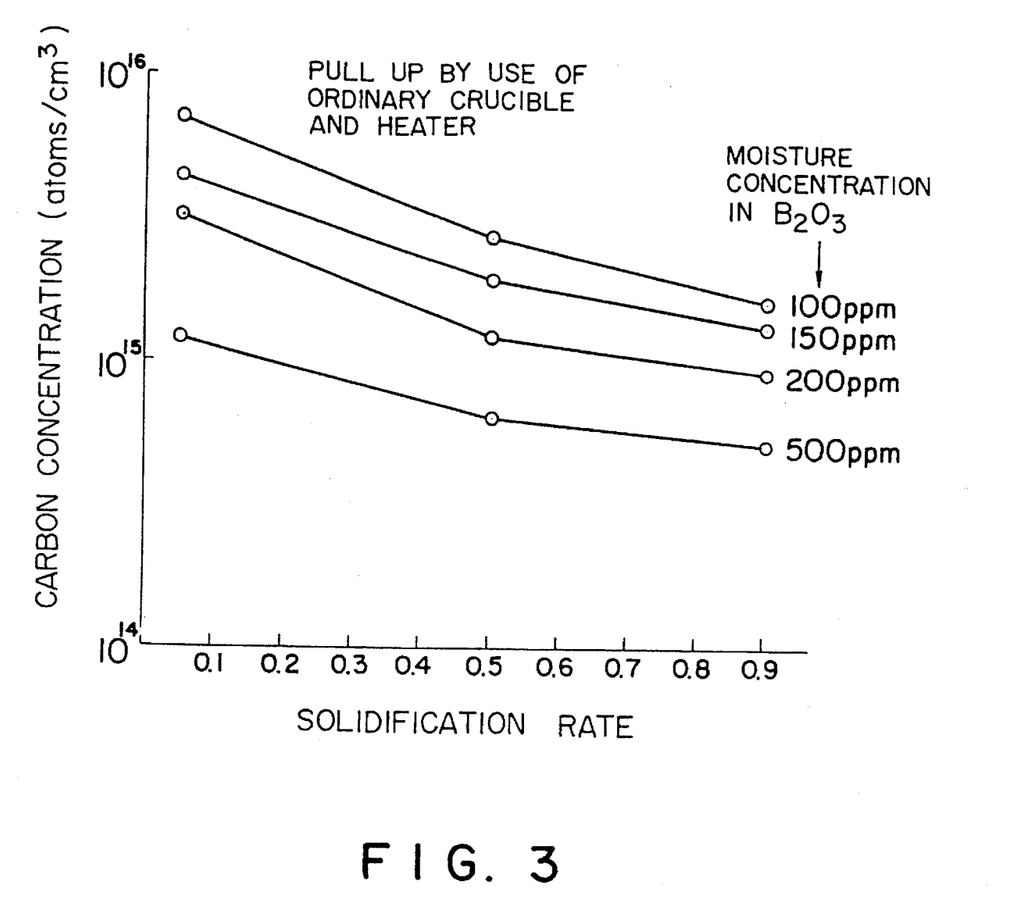
FIG. 3 is a graphical representation showing the relationship between the carbon concentration of crystal and solidification ratio obtained by changing the moisture concentration in the sealing compound $B_2O_3$, in which an ordinary crucible (having no small chamber) and an ordinary heater (the surface is not processed) are used.

FIG. 3 shows the experiment results, that is, the mutual relationship between the carbon concentration in the crystal and the solidification ratio obtained by changing the moisture concentration of the sealing compound $B_2O_3$. FIG. 3 indicates that the carbon concentration in the crystal decreases from the crystal head (a small solidification ratio range) to the crystal tail (a large solidification ratio range). Therefore, in the case where the crystal having the carbon concentration of small absolute values within a narrow range all over the crystal head to the crystal tail is required, for example as when the crystal whose carbon concentration is $1\times10^{15}<[C]<4\times10^{15}$ is required, FIG. 3 indicates that the production yield of tile crystal is very low because of the dispersion of the carbon concentration. This low production yield can be improved by use of the crucible 5 having the crucible body 6 and the small chamber 8 as described later in further detail.

In addition, prior to the experiments of the present invention, some comparative experiments were made to examine the effect of the heater coated with amorphous carbon. Here, the ordinary crucible having no small chamber was used. Under the same pulling-up conditions as the above-mentioned experiments, the prepared moisture concentration of the sealing compound $B_2O_3$ were two sorts of 50 and 100 ppm. The heater 4 coated with amorphous carbon and the ordinary heater coated no amorphous carbon were used.

Figure 4:
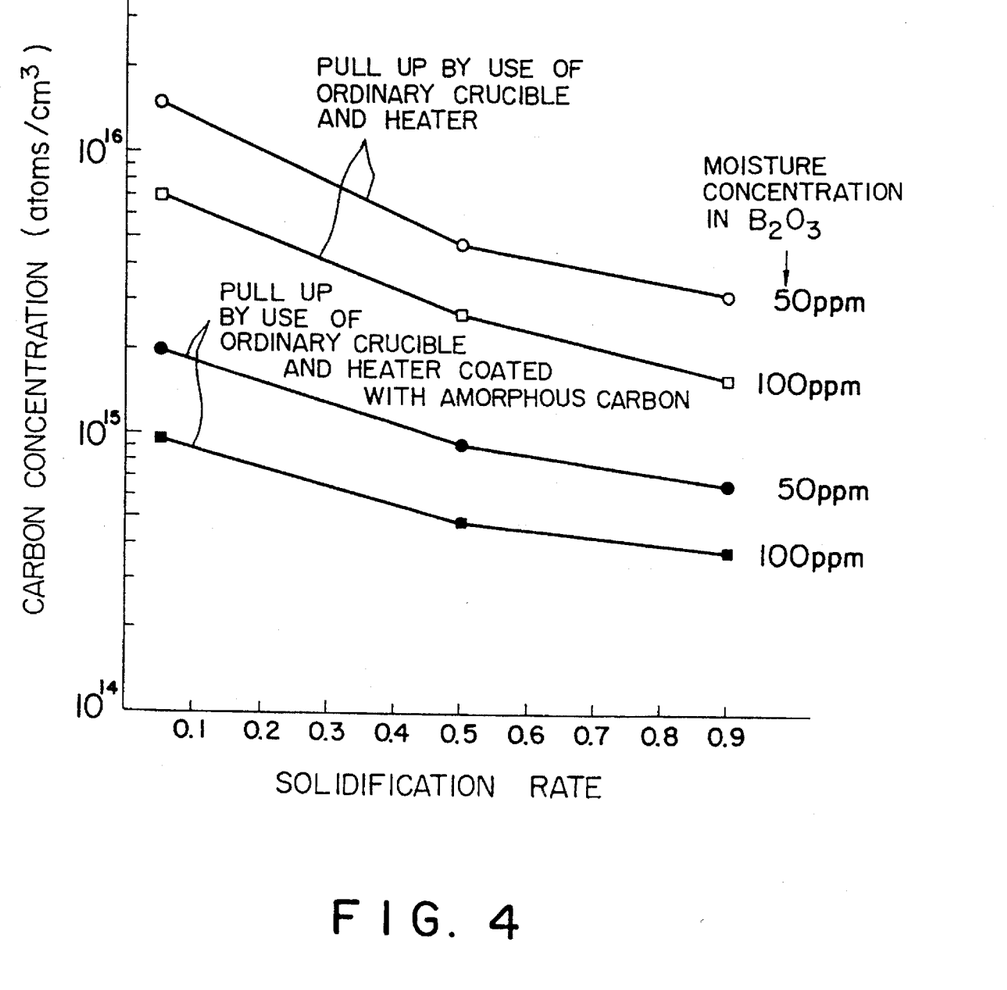
FIG. 4 is a similar graphical representation showing the relationship between the carbon concentration of crystal and solidification ratio obtained by changing the moisture concentration in the sealing compound $B_2O_3$, in which an ordinary crucible (having no small chamber) and an invention heater (the surface is processed by amorphous carbon) are used, in comparison with the use of an ordinary crucible and an ordinary heater.

FIG. 4 shows the experiment results, which indicates that when the heater 4 coated with amorphous carbon is used, the carbon concentration in the crystal can be reduced markedly down to about 1/10 of that obtained by use of the ordinary heater having no amorphous carbon.

The experiments of the present invention will be explained hereinbelow.

The used crucible 5 was formed with both the crucible body 6 and the small chamber 8. The experiments were made by setting the moisture concentration of the sealing compound $B_2O_3$ put in the crucible body 6 to three sorts of 30, 50 and 100 ppm and the moisture concentration of the sealing compound $B_2O_3$ put in the small chamber 8 to 50 ppm, respectively.

Carbon was doped intentionally to the melted GaAs liquid put in the small chamber 8. However, the doped carbon was solidified roughly uniformly from the crystal head (the small solidification range) to the crystal tail (the large solidification range) in the crystal grown under the condition that the moisture concentration of the sealing compound $B_2O_3$ put in the crucible body 6 was 50 ppm.

Figure 5:
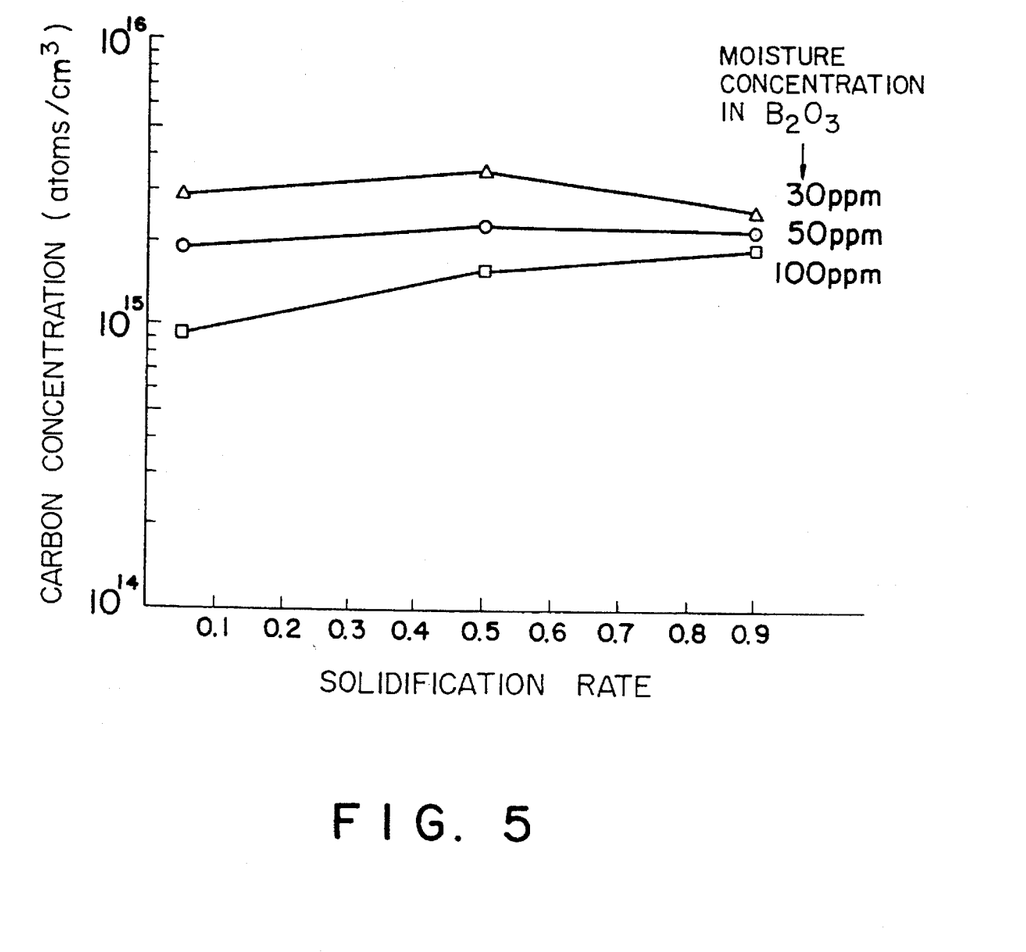
FIG. 5 is a similar graphical representation showing the relationship between the carbon concentration of crystal and solidification ratio obtained by changing the moisture concentration in the sealing compound $B_2O_3$, in which an invention crucible (having a small chamber) and an invention heater (the surface is processed by amorphous carbon) are used.

FIG. 5 shows the experiment results of the present invention, which indicates that there exists a difference in carbon concentration at the crystal head according to the moisture concentration of the sealing compound $B_2O_3$ put in the crucible body 6 (i.e., the lower the moisture concentration is, the higher will be the carbon concentration). However, the difference in carbon concentration between the moisture concentrations of the sealing compound $B_2O_3$ is reduced to a constant common value toward the crystal tail. This constant common value can be roughly determined on the basis of the carbon concentration of the melted GaAs liquid put in the small chamber 8. In addition, the difference in carbon concentration is narrowed from the crystal head to the crystal tail. Even when the carbon concentration [C] is required to lie within a range of $1\times10^{15}<[C]<4\times10^{15}$, FIG. 3 indicates that the carbon concentration disperses within a desired ranged roughly over all the length of the crystal in the case where the moisture concentration of the sealing compound $B_2O_3$ is 30 or 50 ppm, and roughly over all the length of the crystal (except a part thereof) in the case where the moisture concentration of the sealing compound $B_2O_3$ is 100 ppm.

As described above, in the present invention, it is possible to control the distribution of absolute value of the carbon concentration of the pulled-up crystal in the crystal length direction from the crystal head to the crystal tail, on the basis of the simple conditions as follows:

(1) The surface of the carbon heater 5 for heating the raw material is coated with amorphous carbon.

(2) The crucible 5 for accommodating the raw material is separated into the crucible body 6 and the small chamber 8.

(3) The sealing compound $B_2O_3$ of less than 100 ppm is used in both the crucible body 6 and the small chamber 8.

(4) The melted GaAs liquid in the small chamber 8 is doped by carbon (C), and the carbon concentration is adjusted according to the target [C] concentration in the crystal.

Further, in the above-mentioned embodiment, since the manufacturing apparatus according to the present invention is basically the same as the conventional pull-up apparatus from hardware standpoint, excepting that the heater 4 is surface-processed and the crucible 5 is separated into the crucible body 6 and the small chamber 8, the manufacturing method according to the present invention can be realized easily with the use of the conventional manufacturing apparatus improved as described above.

What is claimed is:

1. A method of manufacturing a semi-insulation GaAs monocrystal in accordance with the liquid encapsulated Czochralski method, which comprises the steps of:

preparing a crucible formed of a crucible body and a small chamber communicating with a lower part of the crucible body, the cross-sectional area of the small chamber being smaller than that of the crucible body, and a carbon heater processed to reduce surface blow holes thereof;

placing a molten GaAs liquid and a sealing compound $B_2O_3$ in the crucible housed in an airtight vessel in such a way that the sealing compound $B_2O_3$ is on the molten GaAs liquid, the molten GaAs liquid put in the small chamber containing carbon to be supplied to the molten GaAs liquid put in the crucible body;

heating the crucible by the heater housed in the airtight vessel; and pulling up the molten GaAs liquid from the crucible body by keeping the airtight vessel at a high pressure.

2. A method of manufacturing a semi-insulation GaAs monocrystal in accordance with the liquid encapsulated Czochralski method, which comprises the steps of:

preparing a crucible formed of a crucible body and a small chamber communicating with a lower part of the crucible body, the cross-sectional area of the small chamber being smaller than that of the crucible body, and a carbon heater processed to reduce surface blow holes thereof;

placing a molten GaAs liquid and a sealing compound $B_2O_3$ in the crucible housed in an airtight vessel in such a way that the sealing compound $B_2O_3$ is on the molten GaAs liquid, the moisture concentration of the sealing compound $B_2O_3$ placed in the small chamber being determined lower than that of the sealing compound $B_2O_3$ in the crucible body;

heating the crucible by the heater housed in the airtight vessel; and pulling up the molten GaAs liquid from the crucible body by keeping the airtight vessel at a high pressure.

3. The method of manufacturing a semi-insulation GaAs monocrystal of claim 1, wherein the carbon heater is processed by coating an amorphous carbon on a non-processed surface thereof.

4. The method of manufacturing a semi-insulation GaAs monocrystal of claim 2, wherein the carbon heater is processed by coating an amorphous carbon on a non-processed surface thereof.

5. The method of manufacturing a semi-insulation GaAs monocrystal of claim 1, wherein the moisture concentration of the sealing compound $B_2O_3$ is set less than 100 ppm in both the crucible body and the small chamber.

6. The method of manufacturing a semi-insulation GaAs monocrystal of claim 2, wherein the moisture concentration of the sealing compound $B_2O_3$ is set less than 100 ppm in both the crucible body and the small chamber.

7. The method of manufacturing a semi-insulation GaAs monocrystal of claim 5, wherein the moisture concentration of the sealing compound $B_2O_3$ is set less than 100 ppm in the crucible body and less than 50 ppm in the small chamber.

8. The method of manufacturing a semi-insulation GaAs monocrystal of claim 6, wherein the moisture concentration of the sealing compound $B_2O_3$ is set less than 100 ppm in the crucible body and less than 50 ppm in the small chamber.

9. The method of manufacturing a semi-insulation GaAs monocrystal of claim 1, wherein a thickness of the sealing compound $B_2O_3$ in the small chamber is thinner than that of the sealing compound $B_2O_3$ in the crucible body.

10. The method of manufacturing a semi-insulation GaAs monocrystal of claim 2, wherein a thickness of the sealing compound $B_2O_3$ in the small chamber is thinner than that of the sealing compound $B_2O_3$ in the crucible body.

11. The method of manufacturing a semi-insulation GaAs monocrystal of claim 1, wherein a cross-sectional area of the small chamber increases downward.

12. The method of manufacturing a semi-insulation GaAs monocrystal of claim 2, wherein a cross-sectional area of the small chamber increases downward.

13. An apparatus for manufacturing a semi-insulation GaAs monocrystal in accordance with the liquid encapsulated Czochralski method, comprising:

a crucible housed in an airtight vessel and formed of a crucible body and a small chamber communicating with a lower part of the crucible body, the cross-sectional area of the small chamber being smaller than that of the crucible body, a molten GaAs liquid and a sealing compound $B_2O_3$ being both placed in the crucible in such a way that the sealing compound $B_2O_3$ is on the molten GaAs liquid; and a heater housed in the airtight vessel, for heating said crucible, said heater being processed to reduce surface blow holes thereof.

14. The apparatus for manufacturing a semi-insulation GaAs monocrystal of claim 13, wherein said carbon heater is processed by coating an amorphous carbon on a non-processed surface thereof.

15. The apparatus for manufacturing a semi-insulation GaAs monocrystal of claim 13, wherein the cross-sectional area of the small chamber increases downward.

* * * * *